(12) United States Patent
Farmer et al.

(10) Patent No.: US 10,777,421 B2
(45) Date of Patent: Sep. 15, 2020

(54) TECHNOLOGIES FOR SELECTIVELY ETCHING OXIDE AND NITRIDE MATERIALS AND PRODUCTS FORMED USING THE SAME

(71) Applicant: Intel Corporation, Santa Clara, CA (US)

(72) Inventors: Jason A. Farmer, Hillsboro, OR (US); Gopinath Trichy, Hillsboro, OR (US); Justin S. Sandford, Tigard, OR (US); Daniel B. Bergstrom, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/706,992

(22) Filed: Sep. 18, 2017

(65) Prior Publication Data

US 2018/0005841 A1 Jan. 4, 2018

Related U.S. Application Data

(62) Division of application No. 15/100,268, filed as application No. PCT/US2013/078118 on Dec. 27, 2013, now abandoned.

(51) Int. Cl.
*H01L 21/311* (2006.01)
*H01L 21/3065* (2006.01)
(Continued)

(52) U.S. Cl.
CPC .... *H01L 21/31116* (2013.01); *H01L 21/3065* (2013.01); *H01L 21/324* (2013.01);
(Continued)

(58) Field of Classification Search
None
See application file for complete search history.

(56) References Cited

U.S. PATENT DOCUMENTS 6,461,969 B1 10/2002 Lee et al.
7,781,273 B2 8/2010 Schepis et al.
(Continued)

FOREIGN PATENT DOCUMENTS

| CN | 1800972 A | 7/2006 |
|---|---|---|
| CN | 102160154 A | 8/2011 |
| CN | 102822947 A | 12/2012 |

OTHER PUBLICATIONS

Chinese Office action received in Chinese Patent Application No. 201380081208 dated Nov. 1, 2018, 7 pages.
(Continued)

*Primary Examiner* — Steven B Gauthier
(74) *Attorney, Agent, or Firm* — Schwabe, Williamson & Wyatt, P.C.

(57) ABSTRACT

Technologies for selectively etching oxide and nitride materials on a work piece are described. Such technologies include methods for etching a work piece with a remote plasma that is produced by igniting a plasma gas flow. Microelectronic devices including first and second fins that are laterally offset by a fin pitch to define a first field there between are also described. In embodiments the microelectronic devices include a conformal oxide layer and a conformal nitride layer on at least a portion of the first and second fins, where the conformal nitride layer is on at least a portion of the conformal oxide layer and a sacrificial oxide material is disposed within the first field.

11 Claims, 3 Drawing Sheets

(51) Int. Cl.

| | |
|---|---|
| *H01L 29/06* | (2006.01) |
| *H01L 21/762* | (2006.01) |
| *H01L 29/66* | (2006.01) |
| *H01L 21/324* | (2006.01) |
| *H01L 21/8234* | (2006.01) |
| *H01L 27/088* | (2006.01) |
| *H01L 29/78* | (2006.01) |

(52) U.S. Cl.
CPC .......... *H01L 21/76229* (2013.01); *H01L 21/823431* (2013.01); *H01L 27/0886* (2013.01); *H01L 29/0649* (2013.01); *H01L 29/66795* (2013.01); *H01L 29/7851* (2013.01)

(56) References Cited

U.S. PATENT DOCUMENTS

| | | |
|---|---|---|
| 8,252,696 B2 | 8/2012 | Lu et al. |
| 8,569,812 B2 | 10/2013 | Chang et al. |
| 2002/0132484 A1 | 9/2002 | Lai et al. |
| 2003/0173675 A1 | 9/2003 | Watanabe et al. |
| 2004/0262676 A1* | 12/2004 | Lee .................. H01L 29/66795 257/328 |
| 2005/0202608 A1 | 9/2005 | Beintner |
| 2006/0088967 A1 | 4/2006 | Hsiao et al. |
| 2009/0104782 A1 | 4/2009 | Lu et al. |
| 2011/0065276 A1 | 3/2011 | Ganguly et al. |
| 2014/0353795 A1* | 12/2014 | Tong ................. H01L 21/76224 257/506 |
| 2015/0079799 A1 | 3/2015 | Nemani et al. |

OTHER PUBLICATIONS

European Office action received in European Patent Application No. 2013900277 dated Nov. 11, 2018, 4 pages.
International Preliminary Report on Patentability and Written Opinion issued in PCT Application No. PCT/US2013/078118, dated Jul. 7, 2016, 7 pages.
International Search Report and Written Opinion issued in PCT Application No. PCT/US2013/078118, dated Sep. 26, 2014. 9 pages.
Xaio, H., et al.: Top Down Method Etch Processes, Nanoscale Manufacturing Curriculum for ATE, NaMCATE, 27 pages.
Mishra, P. et al.: "FinFET Circuit Design", Springer, http://www.springer.com/978-1-4419-7444-0, pp. 23-54.
Extended European Search Report issued in European Application No. 13900277.8, dated Jul. 5, 2017, 7 pages.
Office Action issued in U.S. Appl. No. 15/100,268, dated Apr. 10, 2017, 17 pages.
Final Office Action issued in U.S. Appl. No. 15/100,268, dated Jun. 16, 2017, 17 pages.
Chinese Office Action issued in Chinese Application No. 201380081208.4, dated May 28, 2018, with English translation, 23 pages.
Korean Office Action from related application KR 20167013776 dated Feb. 20, 2020, with English translation.

* cited by examiner

TECHNOLOGIES FOR SELECTIVELY ETCHING OXIDE AND NITRIDE MATERIALS AND PRODUCTS FORMED USING THE SAME

CROSS-REFERENCE TO RELATED APPLICATION

The present application is a divisional of U.S. patent application Ser. No. 15/100,268 filed on May 27, 2016, which is a national stage of PCT Application No. PCT/US2013/078118, filed on Dec. 27, 2013, the entire disclosures of which are incorporated herein by reference.

FIELD

The present disclosure relates to technologies for selectively etching oxide and nitride materials and products formed using such technologies. In particular, the present disclosure relates to technologies for selectively etching oxide and nitride materials on a work piece during the production of a microelectronic device or precursor thereof, as well as microelectronic devices formed using such technologies.

BACKGROUND

Various processes are known for forming integrated circuits and microelectronic devices. Among such processes is the so-called "damascene process," which generally involves using a photoresist and etching processes to selectively remove material from the substrate or other dielectric material. For example, a photoresist material may be deposited on a silicon wafer and subsequently patterned, e.g., by exposure to ultraviolet light, an electron beam, or the like. The substrate may then be etched to remove portions of the substrate that are not protected by the photoresist, e.g., via exposure to a wet etching solution or a plasma.

Fin based field effect transistors, or FINFETs, are one type of microelectronic device that is often produced by a damascene or similar process. As will be understood in the art, production of a FINFET device may include a recess etching process, during which a wet etchant (e.g., a hydrofluoric or nitric acid based etchant) or a direct plasma may be used to remove sacrificial material (e.g., an oxide) to expose at least a portion of fin-like structures which may be embedded therein. Such recess etching processes may also be used to remove oxide and/or nitride coatings that may be present on the fin-like structures, so as to expose the fin material itself for further processing in the production of a microelectronic device.

Although such prior technologies can be effective to etch various materials, the inventors have found that it is becoming increasingly difficult to use them to produce microelectronic devices that are becoming smaller and more complex. This is particularly true with respect to the production of fin based field effect transistors, or FINFETs. Over time, technology trends have driven manufacturers to produce FINFETs that have relatively large fin height, but relatively small or varying fin pitch. The production of such devices with existing wet etching chemistries has proven difficult, due in part to an inability to compensate for variances in the etch rate of such solutions. Indeed, the inventors have observed that the etch rate of some wet etchants may depend on various factors such as fin height, fin pitch, composition of the material being etched, and amount of material being etched. As a result, some wet etchants may be unable to uniformly recess oxide and nitride materials used in a FINFET to the same level, a problem which can potentially lead to device failure.

For example, when hydrofluoric acid based wet etchants were used to perform recess etching in the production of FINFET devices having a fin height of $\geq$ about 35 nm and a fin pitch of $\leq$50 nm, the inventors observed that such etching chemistries produced an uneven recessed field height between fins. This uneven field height was further observed to hamper device isolation and to contribute to the generation of integration errors.

Performing the same recess etching with a dry direct plasma did not address the issue, as the plasma chemistry lacked the selectivity required for this application, resulting in fin erosion and/or implantation of plasma species into the fins.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

As noted in the background, semiconductor devices are shrinking in size but are increasing in complexity. Moreover, increasingly complex and diverse materials are being used in the production of microelectronic devices, including but not limited to various oxides, nitrides, and semiconductor materials. These factors have made it difficult to use prior known nitric and hydrofluoric acid based wet etching chemistries in some applications, particularly those in which it may be desired to etch different materials to the same height. This is due in part to the fact that many nitride and hydrofluoric acid based wet etching chemistries etch oxides at a different rate than nitrides. Therefore when such solutions are contacted with oxide and nitride on a work piece (e.g., during the formation of a microelectronic device or a precursor thereof) the oxide and nitride may be etched at different rates.

The variance in oxide and nitride etch rate may be exacerbated by other factors, such as the amount of surface area exposed to an etchant and the amount of material that has been removed. Indeed, a first portion of a work piece with relatively large surface area may be etched by nitric and hydrofluoric acid based wet etchants at a relatively high etch rate, as compared to a second portion of the same work piece with a relatively low surface area, even if the first and second portions are made of the same material. Moreover, changes in the composition of the oxides and/or nitrides being etched (e.g., as material is removed) may hinder contact of the wet etching chemistry with the material to be etched, reducing etch rate.

Direct plasma etching has been used in some circumstances where wet etching chemistries may not be suitable, or are not preferred for some reason. As noted previously however, the chemistry used in such plasmas may not be sufficiently selective for some applications. For example when a direct plasma was used to etch a work piece in the production of a semiconductor device, the inventors observed that it may attack materials other than those for which etching is desired. This may be particularly problematic when such a plasma is to be used to etch a sacrificial material around a structure (e.g., a fin of a FINFET), but is not selective enough to etch the sacrificial material without also substantially etching the material forming the structure.

With the foregoing in mind, the present disclosure generally relates to technologies for selectively etching oxide and nitride materials on a work piece. Among other things, the technologies described herein include methods of selectively etching oxide and nitride materials on a work piece via plasma etching. Generally, the remote plasma contains reactive species that may be produced by igniting a plasma gas flow into a plasma. Etching of the oxide and nitride may proceed by exposing a work piece to the reactive species in the plasma. During such exposure the reactive species may react with the oxide and nitride materials in such a way that they may be removed from the work piece, e.g., by thermal annealing.

As will be later described, the amount of various reactive species in the plasma may be controlled by adjusting the composition of the plasma gas flow. Controlling the amount of those reactive species may in turn control the rate at which the plasma etches oxide and nitride materials relative to one another. That is, adjusting the composition of the plasma gas flow used to produce the plasma may control the oxide:nitride etch ratio (e.g., oxide etch rate:nitride etch rate) exhibited by the plasma produced from the plasma gas flow. This can enable the design and use of multistep plasma etching processes in which a work piece may be exposed to a plurality of etching operations, wherein the composition of the plasma gas flow used during each etching operation may be tuned to achieve a desired oxide:nitride etch ratio.

The plasma etching technologies described herein can also enable the production of microelectronic devices that include diverse oxide and nitride materials, wherein two or more of such materials are etched to the same or substantially the same height. Such etching may be accomplished even in instances where the diverse materials to be etched have a different surface area on the work piece (e.g., fields between nested and isolated fins), and where etching of other materials (e.g., fin materials) is not desired. Moreover, the plasma etching technologies described herein may be used to produce functional microelectronic devices that include relatively tall and narrow features, such as a FINFET having two or more nested fins separated by a relatively narrow field. The plasma etching processes described herein may also be tuned to allow recess etching of diverse oxides and nitrides from areas surrounding nested and isolated fins so as to meet one or more design goals.

As used herein, the term "substantially" when used in connection with a value, ratio, or a range, generally means +/−5% of that value, ratio, or range. Thus for example, the phrase "substantially 5 angstroms per minute" should be understood as encompassing from about 4.75 to about 5.25 angstroms per minute.

As used herein, the term "work piece" refers to any of a wide variety of substrates, microelectronic devices and components thereof, combinations thereof, and the like, which may include one or more regions in which oxide and nitride materials are used.

As used herein the terms "oxide heavy etch operation" and "oxide heavy cycle" are interchangeably used to refer to a plasma etching operation in which oxide is etched at a faster rate than nitride (i.e., an oxide:nitride etch ratio is greater than 1:1). In some embodiments, oxide heavy etch operations consistent with the present disclosure exhibit an oxide etch ratio ranging from greater than 1:1 to about 15:1 (e.g., about 10:1). In contrast, the term "nitride heavy etch operation" and "nitride heavy cycle" are interchangeably used to refer to a plasma etching operation in which nitride is etched faster than oxide (i.e., oxide:nitride etch ratio is 1:greater than 1). In some embodiments, nitride heavy etch operations consistent with the present disclosure exhibit an oxide:nitride etch ratio ranging from 1:greater than 1 to about 1:1.4.

In some embodiments, the work pieces described herein include a substrate having one or more oxide materials and one or more nitride materials thereon. In some embodiments, at least one oxide material is disposed on at least a portion of the substrate, and at least one nitride material is disposed on at least a portion of the substrate surface, the oxide material or a combination thereof. In other embodiments, at least one nitride material may be disposed on the substrate, and at least one nitride material is disposed on at least a portion of the oxide, at least a portion of the substrate, or a combination thereof. In still further embodiments, the work piece may include oxide and nitride materials that are disposed on a substrate but which are isolated from one another by another material.

Without limitation, the work pieces described herein are preferably in the form of a precursor of a microelectronic device, including but not limited to a precursor of a non-planar transistor such as a fin based field effect transistor (FINFET). In such embodiments the work piece may include first, second and optionally third fins. Such fins may be coated with one or more conformal oxide and nitride layers, and may be embedded in a sacrificial material, such as a sacrificial oxide or nitride. Native oxide (e.g., resulting from oxidation of materials used to produce a fin or other component) may also be present.

As noted previously, the technologies of the present disclosure utilize one or more plasmas to selectively etch oxide and nitride materials on a work piece. Such plasmas may be applied to perform remote or direct plasma etching, and may be formed by applying radio frequency (RF) or other power to a plasma gas flow. Application of such power may ignite the plasma gas flow into a plasma, e.g., by forming reactive species from various components of the plasma gas flow. Without limitation, the plasmas of the present disclosure are preferably used to perform remote plasma etching of a work piece. Without limitation, the plasmas described herein are preferably used to perform isotropic dry remote plasma etching of a work piece.

As previously explained, the composition of the plasma gas flow used to produce a plasma consistent with the present disclosure may control the oxide:nitride etch ratio exhibited by that plasma. With this in mind, the plasma gas flows of the present disclosure generally include nitrogen trifluoride ($NF_3$), hydrogen gas ($H_2$), ammonia gas ($NH_3$), and combinations thereof, either alone or combinations with other components such as a carrier gas. The amount of $NF_3$, $NH_3$, $H_2$ and optional carrier gas in the plasma gas flow may vary widely, and may be controlled by adjusting the flow rate at which each of such components is provided in the plasma gas.

$NF_3$ gas may be included in the plasma gas flows of the present disclosure at a flow rate ranging from greater than 0 to about 70 standard cubic centimeters per minute (sccm), such as about 1 to about 65 sccm, about 5 to about 60 sccm, about 20 to about 50 sccm, or even about 40 to about 50 sccm. Without limitation, the plasma gas flows of the present disclosure preferably include $NF_3$ gas at a flow rate of about 50 sccm.

$NF_3$ is generally included in the plasma gas flows of the present disclosure to facilitate the etching of oxide and nitride via the formation of fluorinated species. Varying the flow rate of $NF_3$ upwards/downwards may result in a plasma exhibiting increased/decreased oxide and nitride etch rates, but little or no difference in oxide:nitride etch ratio. By way of example, reducing the flow rate of $NF_3$ from 50 sccm to about 40 sccm may result in a 20-40% reduction in the oxide and nitride etch rate exhibited by a plasma consistent with the present disclosure, but may have limited or no impact on the oxide:nitride etch ratio exhibited by that plasma.

$NH_3$ gas in the plasma gas flows of the present disclosure is a strong modulator of oxide etch rate, with increased $NH_3$ gas flow generally resulting in plasmas exhibiting increased oxide etch rate and oxide:nitride etch ratio. In this regard, $NH_3$ may be included in the plasma gas flows of the present disclosure at a flow rate ranging from 0 to about 120 sccm, such as from 0 to 100 sccm, from about 0 to about 40 sccm, about 20 to about 90 sccm, or even about 20 to about 40 sccm.

Adjusting $NH_3$ flow rate within the above ranges may in some embodiments result in the production of plasmas exhibiting an oxide etch rate of about 1.4 angstroms/second (A/s) ($NH_3$=0 sccm) to about 15.5 A/s ($NH_3$=40 sccm). Of course, such etch rates are exemplary only, and oxide etch rates above, below, or within the specified etch rates may be achieved by controlling the flow rate of $NH_3$ in the plasma gas flow. Without limitation, $NH_3$ flow rate is preferably within the range of greater than 0 to 40 sccm for an oxide heavy etch operation, and is preferably 0 sccm for a nitride heavy etch operation.

$H_2$ gas in the plasma gas flows of the present disclosure is a modulator of nitride and oxide etch rate. In this regard, $H_2$ gas may be present in the plasma gas flows of the present disclosure at flow rate ranging from 0 to about 850 sccm, such as about 30 to about 850 sccm, about 30 to about 450 sccm, or even about 130 to about 450 sccm. Without limitation, $H_2$ flow rate is preferably within a range of 30 to 130 sccm for an oxide heavy etch operation, and between about 130 to about 450 sccm for a nitride heavy etch operation. In some embodiments $H_2$ flow rate was about 130 sccm for a nitride heavy etch operation.

As previously noted, adjusting $H_2$ flow rate may have an impact on the rate at which a plasma consistent with the present disclosure etches oxide and nitride, and hence the plasma's oxide:nitride etch ratio. For example, a plasma flow rate including 30 sccm $H_2$ may produce a plasma that etches oxide at a rate of about 1 angstrom/second and nitride at a rate of about 1.5 angstroms/second, whereas a $H_2$ flow rate of 280 sccm may result in a plasma that etches oxide at a rate of about 2.5 angstroms/second and nitride at a rate of about 2.2 angstroms/second. Therefore by adjusting $H_2$ flow rate, it is possible to produce plasmas which exhibit an oxide:nitride etch ratio ranging from 1:greater than 1 to 1:about 1.5, such as from 1:about 1.4.

The amount of carrier gas in the plasma gas flow may range from 0 to about 1000 sccm, such as from greater than 0 to about 1000 sccm, from greater than 0 to about 500 sccm, from greater than 0 to about 100 sscm, or even about 100 to about 500 sccm. In general, the carrier gas may function to dilute reactive in the plasma formed from a plasma gas flow. At relatively high carrier gas flow rates, the carrier gas may suppress oxide and nitride etch rates exhibited by a plasma. For example, a carrier gas may be included in the plasma gas flow at a flow rate of about 100 sccm, with little or no impact on oxide or nitride etch rate. Increasing the carrier gas flow rate to about 500 sccm or more however may decrease the oxide and nitride etch rate exhibited by the plasma by about 10%, relative to a plasma produced from a plasma gas containing no carrier gas or relatively small amounts of carrier gas.

Non-limiting examples of suitable carrier gases that may be included in the plasma gas flows include nitrogen gas, inert gases such as helium, neon, argon, krypton, xenon, combinations thereof, and the like. Without limitation, helium is preferably used as a carrier gas in the plasma gas flows of the present disclosure.

The power applied to produce the plasmas described herein may vary widely, and may be set to any suitable value such as greater than 0 to about 100 W. Without limitation, RF power in a range of about 20 to about 60 W, such as about 20 to about 50 W, or even about 20 to about 40 W is applied to a plasma gas flow to produce a plasma consistent with the present disclosure.

The present disclosure therefore envisions a wide variety of plasma gas flow compositions, wherein flow rate of $NF_3$, $NH_3$, $H_2$ and optional carrier gas may be tailored to produce plasmas that exhibit desired oxide and nitride etching characteristics, including oxide:nitride etch rate. In some embodiments, plasmas suitable for oxide heavy etch operations may exhibit an oxide etch rate ranging from about 0.5 to about 5 angstroms/second, such as about 0.5 to 4 angstroms/second, and an oxide:nitride etch ratio of greater than 1:1 to about 15:1 (e.g., about 10:1). Such plasmas may be obtained for example by adjusting the flow rate of $NF_3$ in a relevant plasma gas flow to within about 5 to about 50 sccm, the flow rate of $NH_3$ within the plasma gas flow to within about 0 to 100 sccm, and the flow rate of $H_2$ within the plasma gas flow to within about 0 to 850 sccm. Without limitation, plasmas suitable for oxide heavy etch operations are produced by applying about 20-50 W (e.g., about 20-40 W) of RF power to a plasma gas flow including $NF_3$ at a flow rate ranging from about 10 to about 50 sccm, $NH_3$ at a flow rate of 0 to 70 sccm, and $H_2$ at a flow rate of about 110 to about 140 sccm (e.g., about 130 sccm).

Plasmas suitable for nitride heavy etch operations may exhibit nitride etch rates ranging from about 0.1 about 2 angstroms/second, such as about 0.1 to 1.8 angstroms/second, and an oxide:nitride etch ratio ranging from 1:greater than 1, such as 1:about 1.4, or even 1:1.2. Such plasmas may be obtained for example by adjusting the flow rate of $NF_3$ in a relevant plasma gas flow to within about 10 to 50 sccm (e.g., about 10 to about 50 sccm), the flow rate of $NH_3$ in the plasma gas flow to 0 sccm, and the flow rate of $H_2$ in the plasma gas flow to within about 30 to about 450 sccm (e.g., about 30 to 130 sccm or even about 130 to about 450 sccm). Without limitation, plasma suitable for oxide heavy etch operations are produced by applying about 20 to about 50 W of RF power to a plasma gas flow containing $NF_3$ at a flow rate of 10-50 sccm, no $NH_3$, and $H_2$ at a flow rate of about 130 to about 450 sccm.

Without wishing to be bound by theory, it is believed that the plasma chemistries of the present disclosure etch oxide and nitride via the production of via a reaction of active species in the plasma with the oxide, resulting in the formation of $NH_4F$ species, hydrofluoric acid, an etch byproduct, and water. Nitride etching is believed to proceed by a reaction of active species in the plasma with the nitride, resulting in the formation of solution of hydrofluoric acid and nitride, the same etch byproduct, but no water. A source of water may therefore be used to tune the selectivity of the plasma chemistries described herein towards nitride.

In some embodiments, the plasmas of the present disclosure produce $NH_4YMF_x$, where M is an element of the oxide or nitride being etched (e.g., silicon, tantalum, etc.) and Y and x are stoichiometric variables. For example, etching of silicon dioxide with a plasma consistent with the present disclosure may produce $(NH_4)2SiF_6$ as an etch byproduct. In some embodiments, the work pieces described herein may be exposed to a plasma at a process temperature ranging from greater than 0 to about 50° C. (e.g., about 30 to 40° C.) so as to etch at least a portion of the oxide and nitride on the substrate. At such temperatures, the etch byproduct noted above may be a solid. However, the etch byproduct may be removed by annealing the work piece at elevated temperature, e.g., about 80 to 120° C. or even about 90 to about 100° C. Such annealing may be performed for a time that is sufficient to remove or substantially the etch byproduct, e.g., from about 15 seconds to about 300 seconds, such as about 30 to about 120 seconds.

As may be appreciated from the foregoing, the plasmas of the present disclosure may be tuned to etch a wide variety of oxides and nitrides and desired oxide:nitride etch ratios. With this in mind, non-limiting examples of suitable oxides that may be etched using the plasmas described herein include carbon doped oxides (CDO), silicon oxides (e.g., $SiO$, $SiO_2$), spun on glass, combinations thereof, and the like. Non-limiting examples of suitable nitrides that may be etched by the plasmas described herein include metal nitrides and metal oxynitrides, such as but not limited to nitrides and oxynitrides, silicon, and combinations thereof. Without limitation, the nitrides are preferably silicon nitride and silicon oxynitride.

The plasmas of the present disclosure may exhibit significant etch selectivity towards oxides and nitrides as noted above, but may not etch or may not substantially etch other materials. By way of example, the plasmas described herein may not etch or may not substantially etch various materials that may be used in the production of microelectronic devices. Such materials include but are not limited to silicon, germanium, metals, III-V semiconductor materials (e.g., SiGe, InAs, InP, etc.), combinations, alloys and mixtures thereof, and the like.

As noted above adjusting the flow rate of various components of the plasma gas flows described herein can enable the production of various plasmas which have desired etching characteristics, such as oxide:nitride etch ratio. With this in mind, another aspect of the present disclosure relates to methods for selectively etching oxide and nitride from a work piece. In this regard, reference is made to FIG. 1, which is a flow diagram depicting exemplary operations of a plasma etching method consistent with the present disclosure.

Figure 1:
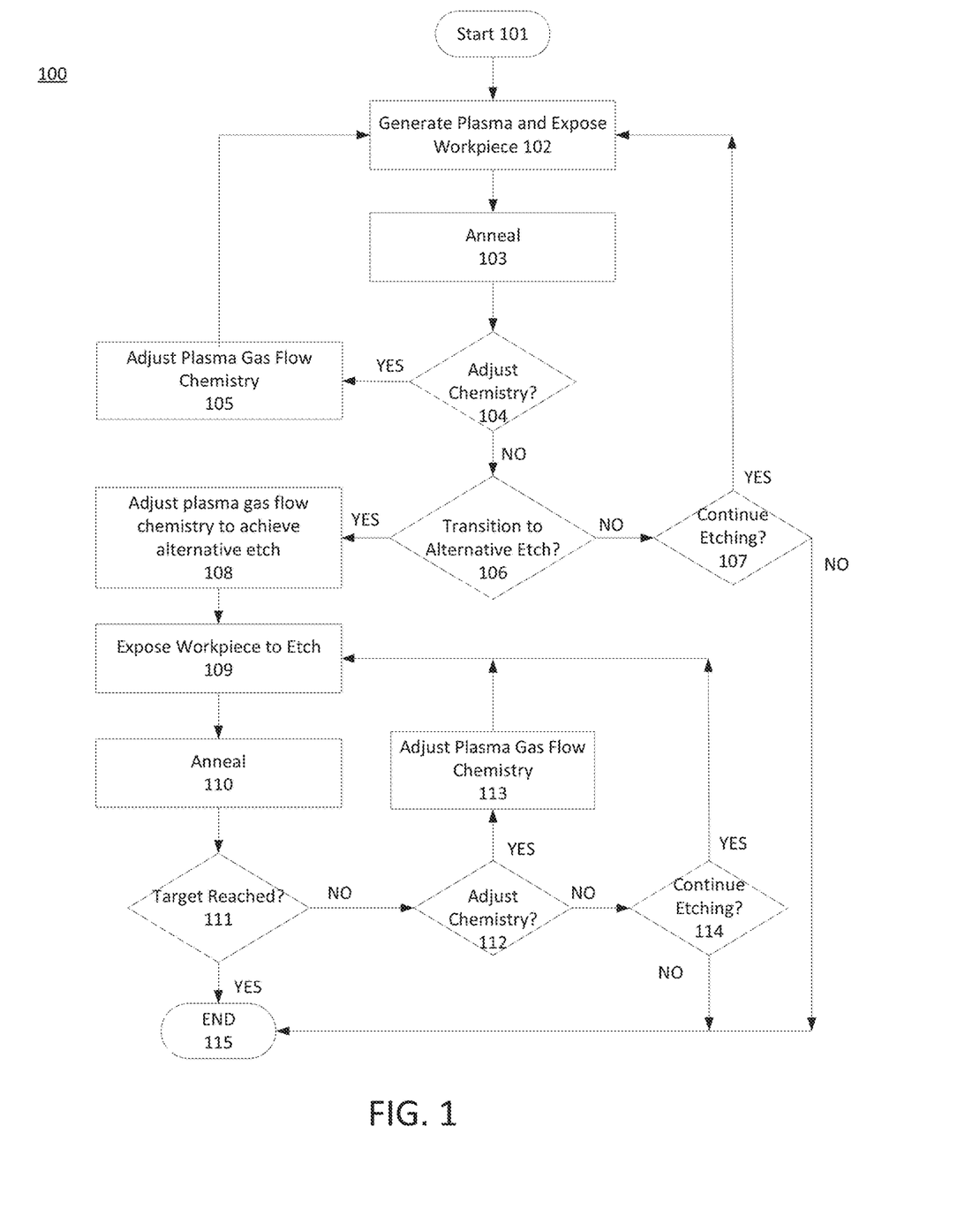
FIG. 1 is a flow diagram depicting exemplary operations of an example remote plasma etching process consistent with the present disclosure.

As shown, method 100 begins at block 101. The method may proceed to block 102, wherein a first plasma may be generated by applying RF or other power to a first plasma gas flow. The first plasma gas flow may include one or more of $NF_3$, $NH_3$, $H_2$ and an optional carrier gas, as discussed.

The flow rate of such components in the first plasma gas flow may be adjusted such that the first plasma exhibits desired etching characteristics, such as a desired oxide:nitride etching ratio. In some embodiments, the flow rate of $NF_3$, $NH_3$, $H_2$, optional carrier gas, or a combination thereof may be set such that the first plasma produced from the first plasma gas composition is suitable for use in an oxide heavy or nitride heavy etching operation.

That is, the flow rate of one or more components in the first plasma gas flow may be set so that the first plasma produced therefrom may exhibit an oxide:nitride etch rate of greater than 1:1 (oxide heavy) or 1:greater than 1 (nitride heavy). In some embodiments, the flow rate of one or more components in the first plasma gas flow may be set so that the first plasma produced therefrom may exhibit an oxide: nitride etch ratio ranging from greater than 1:1 to about 15:1 (e.g., about 10:1). Alternatively, the flow rate of one or more components in the first plasma gas flow may be set so that the first plasma produced therefrom may exhibit an oxide: nitride etch ratio ranging from greater than 1:greater than 1 to about 1:1.4. Without limitation, the first plasma preferably is preferably suitable for performing at least one oxide heavy etch operation.

At this point, etching may proceed by exposing the work piece to active species within the first plasma. Such exposure may take place in any suitable plasma etching chamber, including etching chambers known in the art. Without limitation, exposure of the work piece to the plasmas described herein preferably takes place in a remote plasma chamber, wherein active species of the first plasma are produced from a remote source. As one example of a suitable plasma etching chamber that may be used, mention is made of the SICONI™ plasma chambers commercially available from Applied Materials.

The method may then proceed to block 103, wherein the work piece may be annealed to remove etch byproduct produced by exposure to the first plasma. As noted above, annealing may be performed at a temperature and for a time sufficient to remove or substantially remove the etch byproduct, e.g., from about 80 to 120° C. for about 15 to 300 seconds, such as about 90 to 100° C. for about 30 to 120 seconds. As may be appreciated, removal of the etch byproduct may facilitate further contact of the oxides and/or nitrides on the work piece to reactive species of additional plasmas that may be later applied. Without limitation, such annealing is preferably performed in situ, i.e, while the work piece remains in the plasma chamber. The plasma etching chambers used to expose to work piece to a plasma are therefore preferably equipped to perform in situ annealing.

Before or after removal of the etch byproduct, etch progress may be monitored in situ or ex situ performed by inspecting the surface of the work piece using a suitable technique. By way of example, the surface of a work piece may be inspected using atomic force microscopy, electron microscopy (e.g., scanning electron microscopy, transmission electron microscopy, optical microscopy, interferometry, or another suitable technique known in the art.

The purpose of such monitoring may be to determine whether exposure of the work piece to the first plasma has produced a desired result, such as a desired removal of oxide and/or nitride. For example where a first plasma is configured for oxide or nitride heavy etching, monitoring of the etch progress may be performed to determine whether and if exposure to the first plasma has resulted in the removal of a desired amount of oxide and/or nitride.

The method may then proceed to block 104, wherein a determination may be made as to whether the chemistry of the first plasma gas flow should be adjusted. In this regard, it is noted that the first plasma gas flow may be configured such that the first plasma is suitable for performing oxide or nitride heavy etching operations, where oxide and nitride are removed at a first oxide:nitride etch ratio, oxide is removed at a first oxide etch rate, and nitride is removed at a first nitride etch rate.

Thus for example, the chemistry of the first plasma gas flow may be set such that the first plasma exhibits a relatively high oxide etch rate, relatively low nitride etch rate, and an oxide:nitride etch ratio greater than 1:1 to about 15:1 (e.g., about 10:1). In such instances, exposing the work piece to the first plasma may be suitable for removing more oxide than nitride from the work piece. Alternatively the chemistry of the first plasma gas flow may be set such that the first plasma exhibits an relatively low oxide etch rate, a relatively high nitride etch rate, and an oxide:nitride etch ratio ranging from 1:greater than 1 to about 1:1.4. In such instances, exposing the work piece to the first plasma may be suitable for removing more nitride than oxide from the work piece.

With this in mind, in some embodiments it may be desired to fine tune the oxide/nitride removal rate and oxide:nitride ratio, such as when the plasmas described herein may be used in etching processes during the formation of a microelectronics device, such as a FINFET. With this in mind, pursuant to block 104 it may be decided that an adjustment to the plasma gas flow chemistry is desired, e.g., so as to adjust the rate of oxide/nitride removal and/or the oxide:nitride etch rate of the first plasma.

In such instances, the method may proceed to block 105, wherein the flow rates of one or more of the components of the first plasma gas flow may be adjusted as discussed above, so as to produce a modified first plasma gas flow. The method may then loop back to block 102, wherein a modified first plasma (having different oxide/nitride etching characteristics) may be generated and the work piece is exposed to reactive species in the modified first plasma. The method may then proceed again to blocks 103 and 104.

Blocks 102-105 may repeat until all etching operations with a desired plasma gas flow (or set of plasma gas flows) have been performed. In some embodiments, blocks 102 to 105 may be reiterated from 1 to about 15 times. The plasma produced pursuant to block 102 during any one of such iterations may be the same or different than one or more of the plasmas produced by any other of such iterations.

By way of example, blocks 102 to 105 may be reiterated from 1 to 12 times with plasma gas flows designed to produce plasmas that are each suitable for performing oxide heavy or nitride heavy etching operations on the work piece. The oxide:nitride etch ratio exhibited by a plasma pursuant to any one of such iterations may be the same as the oxide:nitride etch ratio exhibited by the plasmas used in one or a combination of any other of such iterations. Similarly, the oxide and/or nitride etch rate exhibited by a plasma pursuant to any one of such operations may be the same or different from the oxide and/or nitride etch rate exhibited by the plasmas used in one or a combination of any other of such iterations. Without limitation, operations pursuant to blocks 102 to 105 are iterated from 1 to 6 times with plasmas suitable for performing oxide heavy etching operations on the work piece.

If an adjustment to the first plasma gas flow chemistry is not required (or if only one etch operation with the first plasma is performed), the method may proceed to block 106. Pursuant to that block, a determination may be made as to whether a transition to an alternative etching chemistry (alternative etch) will be made. By way of example, pursuant to block 106 a determination may be made as to whether to switch from oxide heavy etching to nitride heavy etching or vice versa, depending on the type of etching operation(s) performed pursuant to block 102. If not, the method may proceed to block 107, wherein a determination may be made as to whether etching is to continue. If so, the method may loop back to block 102. If not, the method may proceed to block 115 and end.

If a transition to an alternative etch is to be made, the method may proceed from block 106 to block 108, wherein the flow rates of $NH_3$, $NF_3$, $H_2$, may be adjusted to produce a second plasma gas flow, which may be ignited (pursuant to block 109) into a second plasma in the same manner as discussed above in connection with the production of a first plasma in block 102.

The flow rates of the second plasma gas flow in some embodiments are preferably set pursuant to block 108 such that the second plasma is suitable for performing oxide heavy etching operations or nitride heavy etching operations. For example, where the first plasma pursuant to block 102 is suitable for oxide heavy etching operations, the second plasma may be suitable for nitride heavy etching operations (e.g., oxide:nitride etch ratio ranging from 1:greater than 1 to about 1:1.4). Likewise when the first plasma pursuant to block 102 is suitable for nitride heavy etching operations, the second plasma may be suitable for oxide heavy etching operations (e.g., oxide:nitride etch ratio ranging from greater than 1:1 to about 15:1 (e.g., about 10:1)).

At this point the method may proceed to block 109, wherein a second plasma is generated using the second plasma gas flow chemistry set pursuant to block 108. Etching of the work piece may then proceed by exposing the work piece to active species within the second plasma. Such exposure may take place in substantially the same manner as exposure of the work piece to the first plasma as discussed above in connection with block 102. Without limitation, exposure of the work piece to the second plasma described herein preferably takes place in a remote plasma chamber, wherein active species of the first plasma are produced from a remote source.

The method may then proceed to block 110, wherein the work piece may be annealed to remove etch byproduct produced by exposure to the second plasma. Annealing pursuant to block 110 may be performed in the same of similar manner as explained above with respect to block 103. That is, the work piece may be annealed at a temperature and for a time sufficient to remove or substantially remove the etch byproduct, e.g., from about 80 to 120° C. for about 15 to 300 seconds, such as about 90 to 100° C. for about 30 to 120 seconds. Without limitation, annealing pursuant to block 110 is preferably performed in situ, i.e, while the work piece remains in the plasma chamber.

Before or after removal of the etch byproduct, monitoring of the etch progress may be performed by inspecting the surface of the work piece using a suitable technique, such as those noted above for block 103. One purpose of such monitoring may be to determine whether exposure of the work piece to the first and second plasmas has achieved a desired etching target. Non-limiting examples of etching targets include the complete formation of desired structures, the removal of a specified amount of oxide and/or nitride, another etching goal (e.g., device design specifications), combinations thereof, and the like.

Pursuant to block 111, a determination may be made as to whether an etching target has been achieved. If not, the method may proceed to block 112, wherein a determination may be made as to whether an adjustment to the second plasma gas flow chemistry is to be made. One purpose of this modification may be to tune the rate at which a plasma produced pursuant to block 109 etches oxide and/or nitride, as well as the oxide:nitride etch ration exhibited by such plasma. If an adjustment to the plasma chemistry will not be made the method may proceed to block 114, wherein a determination may be made as to whether etching is to continue. If so, the method may loop back to block 109. If not, the method may proceed to block 115 and end.

If it is determined pursuant to block 112 that the second plasma gas chemistry is to be adjusted the method may proceed to block 113, wherein the second plasma gas chemistry may be modified in the same manner as described above in connection with the adjustment of the first plasma gas chemistry pursuant to block 105. Therefore a detailed description of how the second plasma gas chemistry may be modified is not reiterated in detail. Generally, the flow rate of $NH_3$, $H_2$ and $NF_3$ in the second plasma gas flow may be adjusted so as to achieve a desired oxide etch rate, nitride etch rate, and oxide:nitride etch ratio.

Consistent with the foregoing discussion, modification of the second plasma gas flow may be done to produce modified second plasma gas flows, which in turn may generate modified second plasmas. Where the second plasma is suitable for oxide heavy etching operations, a modified second plasma may also be suitable for oxide heavy etching operations. Likewise where the second plasma is suitable for nitride heavy etch operations, a modified second plasma may also be suitable of nitride heavy etching operations. Once the second plasma gas flow chemistry has been modified the process may return to block 109, wherein the work piece may be exposed to a modified second plasma generated from the modified second plasma gas flow.

Like blocks 102-106, blocks 109-113 may be repeated until all etching operations with a desired second plasma gas flow (or set of second plasma gas flows) have been performed. In some embodiments, blocks 109 to 113 may be reiterated from 1 to about 15 times. The plasma produced pursuant to block 109 during any one of such iterations may be the same or different than one or more of the plasmas produced by any other of such iterations.

In any case, once an etching target is reached or if a determination is made pursuant to block 114 that etching is not to continue, the method may proceed to block 115 and end.

As may be appreciated from the foregoing, the technologies of the present disclosure may enable the use of highly flexible etching processes, which may involve one or a plurality of etching operations. Each etching operation may be performed using a plasma generated from a plasma gas flow, which may be modified to adjust one of more of the plasma's oxide etch rate, nitride etch rate, and oxide:nitride etch ratio. As a result, the technologies described herein can enable lab technicians to design multistep etching operations which may be used to etch oxide and nitride in a highly flexible manner. As will be described in detail below, this flexibility may be significantly useful in the performance of recess etching operations, such as those that may be used during the production of microelectronic devices such as FINFETS, particularly FINFETs that include nested fins that are relatively tall and which are separated by a relatively low fin pitch, either alone or in combination with isolated fins.

With the foregoing in mind, another aspect of the present disclosure relates to methods of producing non-planar microelectronic devices (non-planar devices), including but not limited to non-planar transistors such as FINFETs. Such non-planar devices may include one or more fin like structures, such as may be used in a FINFET or other microelectronic device. As will be appreciated in the art, the composition and pitch (spacing) of the fins in a FINFET may vary considerably.

By way of example, fins may be produced by etching a semiconductor substrate (e.g., a silicon or germanium wafer. Alternatively or additionally, fins comprising one or more materials such as SiGe, alternating layers of silicon and germanium, III-V semiconductors, (e.g., InP, InAs, etc.) may be deposited or grown on a substrate so as to form one or more fins thereon.

The lateral spacing of (i.e., fin pitch) of such fins may vary considerably, and may range from about 5 nm to about 100 nm or more, as measured from the edge of one fin to the edge of an adjacent fin. In some embodiments, at least some of fins are separated by a fin pitch of less than about 50 nm. In further embodiments, at least some of the fins may be separated by a fin pitch less than about 50 nm, whereas other fins may be separated by a fin pitch greater than 50 nm, such as greater than 100 nm or even 200 nm. Thus for example a FINFET consistent with the present disclosure may include a plurality of "nested" fins (i.e., fins which have relatively low fin pitch), as well as one or more isolated fins (i.e., fins which have a relatively large fin pitch). The fin pitch of a first pair of fins may therefore differ from the fin pitch of a second pair of fins in the same FINFET.

As will also be appreciated in the art, various coatings may be grown and/or applied to the fins of a non-planar microelectronic device, such as a FINFET. For example, when a material used to form a fin is reactive to oxygen, a native oxide may form at the surface thereof when the fin is exposed to oxygen, e.g., in the air. In some embodiments the fins of the non-planar devices described herein include silicon, and a layer of native silicon oxide is present on the surface of such fins.

Alternatively or additionally, one or more layers of an oxide, a nitride or combinations thereof may be applied to each fin in a non-planar device. Such layers may serve various purposes known in the art. For example, oxide and nitride layers may serve to isolate fins from one another. Alternatively of additionally, such layers may act as a diffusion barrier, e.g., to prevent diffusion of dopant materials out of a fin.

Non-planar devices such as those noted above may be produced by methods that involve recess etching a sacrificial material (e.g, an oxide) and the aforementioned oxide and nitride layers to expose a portion of a fin. The degree to which the fin material extends above the oxide and nitride layers is referred to herein as the "fin height," "target fin height," or TFH. As explained in the background, nitric acid and hydrofluoric acid based wet etchants are capable of recessing the sacrificial material and the oxide and nitride layers. However, the rate at which such etchants remove oxide and nitride varies with material composition, as well as fin pitch, fin height, and potentially other factors.

As a result, it is difficult or impossible to produce fins with a uniform fin height when such etchants are used to perform recess etching to produce a non-planar device having a plurality of fins that are relatively tall and which have relatively low fin pitch. This is particularly true in instances where target fin height exceeds about 35 nm, and fin pitch is less than about 50 nm. This problem is exacerbated when the non-planar device to be formed includes fins that have a fin pitch of less than about 50 nm, as well as fins with relatively large fin pitch.

Nitric acid and hydrofluoric acid based wet etchants may also etch the sacrificial material at different rates, depending on the degree to which the sacrificial material is exposed to the etchant. For example, such wet etching chemistries may etch sacrificial material in a first region between fins having a relatively small fin pitch (e.g., less than or equal to about 50 nm) at a relatively slow rate, but may etch sacrificial material in a second region between fins having a relatively large fin pitch (e.g., greater than about 50 nm) at a higher rate. As a result, the upper surface of the sacrificial material in the second field may be lower than the upper surface of the sacrificial material in the first field, even if the sacrificial material is exposed to the same wet etchant. If the upper surface of the sacrificial material in either field is significantly lower than a nitride layer on an adjacent fin, failure of the device may occur.

Put in other terms, if a nitride layer remaining on a fin extends significantly above the upper surface of the upper surface of a sacrificial material in an adjacent field, failure of the device may occur. In this regard, a nitride layer may be considered to significantly extend above an upper surface of a sacrificial material if an upper portion of the nitride layer is greater than 5 nm above the upper surface of the sacrificial material in an adjacent field. Without limitation, the non-planar devices described herein are preferably formed such that a nitride layer on each fin extends less than 2 nm above the upper surface of a sacrificial material in an adjacent field, even when the fin pitch is less than about 50 nm and the fin height is greater than about 35 nm.

Figure 2A:
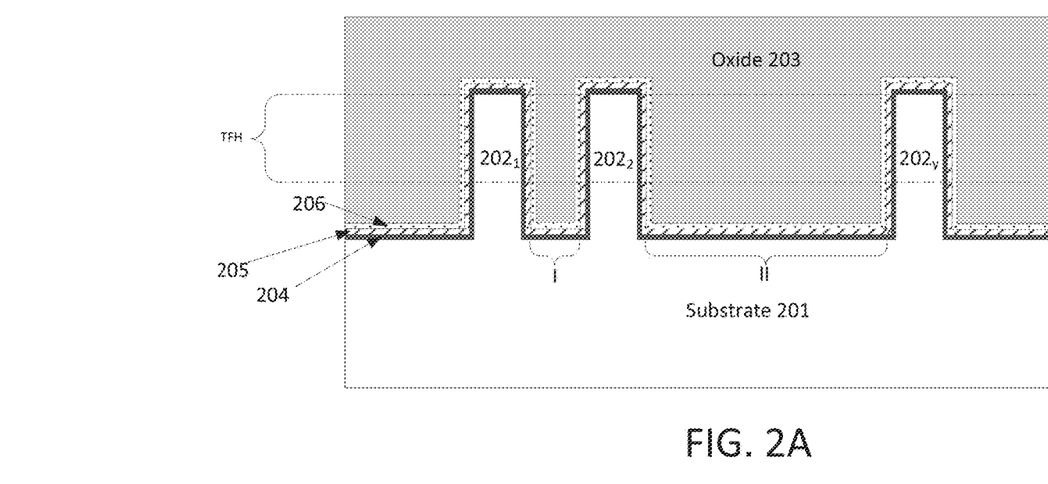
FIGS. 2A-C stepwise illustrate one example of a process flow for performing recess etching to expose fins of a microelectronic device using a remote plasma etching process consistent with the present disclosure.
Figure 2B:
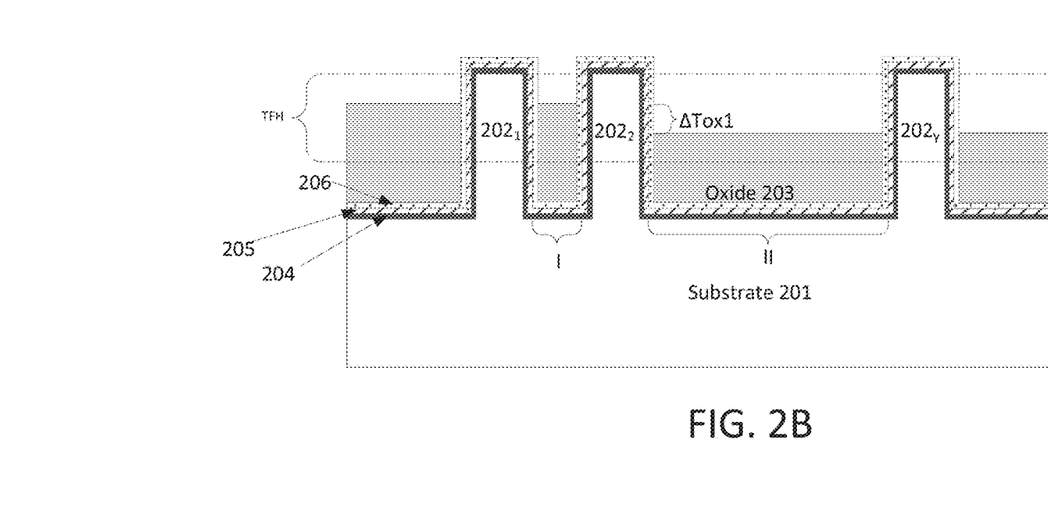
Figure 2C:
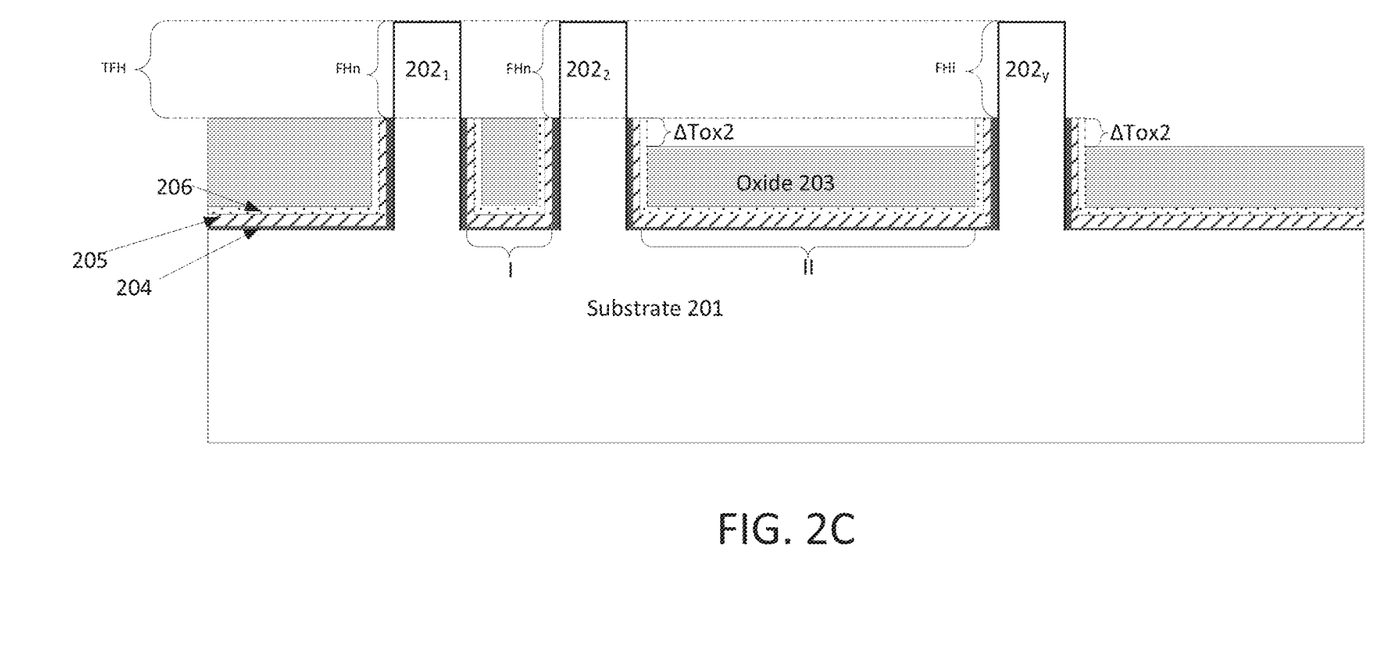

For the sake of illustration, the present disclosure will now proceed to describe one example of a method of forming a non-planar device such as a FINFET using the plasma etching technologies described herein. Reference is therefore made to FIGS. 2A-2C, which stepwise illustrate the production of a non-planar device including a plurality of fins consistent with the present disclosure. Although the illustrations of FIGS. 2A-2C may apply to the production of any suitable non-planar device, such illustrations may be particularly understood to apply stepwise illustrate a recess etching process that may be used to form a FINFET, e.g., from work piece 200.

As shown in FIG. 2A, work piece 200 may include a substrate 201, which may be any suitable substrate that may be used in the production of a microelectronic device. Non-limiting examples of materials that may be used as substrate 201 include silicon, silicon on insulator, germanium, metals, SiGe, III-V semiconductor materials, combinations thereof, and the like. Without limitation, substrate 201 is preferably formed from silicon.

Work piece 200 may further include a plurality of fins, such as fin $201_1$, fin $201_2$, and fin $201_y$, where y is an integer greater than or equal to 3. Fins $201_1$, $201_2$, $201_y$ may be formed by etching substrate 201 as noted above. Alternatively, one or more of Fins $201_1$, $201_2$, $201_y$ may be grown on substrate 201 using any suitable process known in the art. Without limitation, one or more of Fins $201_1$, $201_2$, $201_y$ may be formed from silicon, germanium, SiGe, a III-V semiconductor, combinations thereof, and the like. Without limitation, Fins $201_1$, $201_2$, and $201_y$ are preferably formed from SiGe or layers of Si and Ge, either of which may be grown or otherwise deposited on substrate 201.

Any or all of fins $201_1$, $201_2$, $201y$ may be doped with one or more n or p type dopants, using any suitable process known in the art. One example of a suitable n-type dopant is phosphorous, and one example of a suitable p-type dopant is boron. Of course, other p and/or n type dopants may be used. The concentration of such dopants may vary widely, as generally understood in the art.

In the embodiment of FIG. 2A, fins $202_1$, $202_2$ are illustrated as nested fins. That is, such fins are illustrated as being laterally spaced from one another by a relatively small fin pitch, FP1. FP1 may be any suitable fin pitch for forming nested fins. Without limitation, FP1 is preferably less than or equal to about 50 nm, such as less than or equal to about 40 nm, about 30 nm, about 20 nm, or even about 10 nm. The space of fins $202_1$, $202_2$ defines first field (I) there between. In the illustrated embodiment, the right side of fin $201_1$ is nested with fin $201_2$, but no other fin is illustrated to the left of fin $201_1$. It should be understood that this illustration is exemplary, and that additional nested or isolated fins may be present (to the left of fin $201_1$ or otherwise).

For the sake of illustration FIG. 2A also depicts an embodiment in which work piece 200 includes fin $202y$, and wherein fins $202_2$ and $202_y$ are laterally spaced by a relatively large fin pitch, FP2. Fin $202_y$ may therefore be understood as corresponding to an isolated fin, one or more of which may be used in a non-planar device. FP2 may be any suitable pitch for one or more isolated fins. Without limitation, FP2 is preferably greater than 50 nm, such as greater than 75 nm, greater than 100 nm, or more.

As further shown in FIG. 2A, work piece 200 may include native oxide layer 204, which may be disposed over a surface of fins $202_1$, $202_2$, $202_y$. For the sake of illustration native oxide layer 204 is shown as a conformal layer on the sides and upper surface of such fins. It should be understood that this illustration is exemplary, and that native oxide layer 204 may be present as a non-conformal layer on one or more of fins $202_1$, $202_2$, $202_y$. Moreover in instances where the materials used to form fins $202_1$, $202_2$, and $202_y$ are not reactive, native oxide layer 204 may not be present. In some embodiments, native oxide layer 204 is a conformal layer of a silicon oxide, such as $SiO_2$. In such embodiments, fins $202_1$, $202_2$, and $202_y$ may be formed at least in part by a silicon containing material.

Work piece 200 may further include oxide layer 205. In the embodiment of FIG. 2A, oxide layer 205 is illustrated as a conformal layer that is present on side and upper surfaces of fins $202_1$, $202_2$, and $202_y$, as well as within first region I and second region II. Of course, oxide layer 205 may be present in another configuration, such as a conformal or non-conformal layer that is only on the side and upper surfaces of fins $202_1$, $202_2$, $202_y$.

Oxide layer 205 may be formed from any suitable oxide material. Non-limiting examples of such materials include silicon oxide, a silicate, carbon doped oxide, spun on glass, and combinations thereof. Without limitation, oxide layer 205 is preferably a silicate glass that is doped with one or more n or p type dopants, such as boron or phosphorous. In some embodiments, oxide layer 205 may function as a diffusion barrier layer to prevent migration of dopants from fins $202_1$, $202_2$, and $202_y$.

The thickness of oxide layer 205 may vary widely. For example, the thickness of oxide layer 205 may range from about 10-50 angstroms. Without limitation, the thickness of oxide layer 205 preferably ranges from about 20 angstroms.

Work piece 200 further includes nitride layer 206. In the embodiment of FIG. 2A, nitride layer 206 is illustrated as a conformal layer that is present on oxide layer 205. Nitride layer 206 may therefore extend over the same surfaces of substrate 201 and fins $202_1$, $202_2$, and $202_y$ as oxide layer 205. Of course, nitride layer 206 may be present in another configuration, such as a conformal or non-conformal layer that is only on the side and upper surfaces of fins $202_1$, $202_2$, $202_y$ (or oxide layer 205 thereon).

Nitride layer 206 may be formed from any suitable nitride material, including transition metal nitrides and oxynitrides. Non-limiting examples of suitable materials that may be used to form nitride layer 206 include silicon nitride and silicon oxynitride. Without limitation, nitride layer 206 is preferably silicon nitride. In any case, nitride layer 206 may be doped with one or more n or p type dopants, such as boron or phosphorous. In some embodiments, nitride layer 206 may function (either alone or in conjunction with oxide layer 205) as a diffusion barrier layer to prevent migration of dopants from fins $202_1$, $202_2$, and $202_y$.

The thickness of nitride layer 206 may vary widely. For example, the thickness of nitride layer 206 may range from about 10-70 angstroms. Without limitation, the thickness of oxide layer 206 preferably ranges from about 50 angstroms.

As further shown in FIG. 2A, work piece 200 may include sacrificial oxide 203. As shown, sacrificial oxide 203 may be disposed on substrate 201 (or more particularly, on nitride layer 205) such that it fills regions I and II and fins $202_1$, $202_2$, and $202_y$ are embedded therein. Sacrificial oxide 203 may be any suitable sacrificial oxide known in the art, so long as it may be etched by the plasmas described herein, and function to isolate fins $202_1$, $202_2$, and $202_y$ from one another. In some embodiments, sacrificial oxide 203 is a silicon oxide or silicate, such as spun on glass. Of course, other oxides may be used as sacrificial oxide 203.

During the production of a non-planar device such as a FINFET, the plasma etching processes described above may be used to recess portions of sacrificial oxide 203, so as to expose at least a portion of fins $202_1$, $202_2$, and $202_3$. This concept is shown in FIG. 2B, which illustrates work piece after exposure to one or more plasma etching operations consistent with the present disclosure.

To produce the structure of FIG. 2B, work piece 200 of FIG. 2A may be placed in a plasma processing chamber, and processed with one or more plasma etching processes consistent with the present disclosure so as to remove at least a portion of sacrificial oxide 203. In some embodiments, initial etching of work piece 200 may proceed using one or more plasma gas flows that are configured to produce plasma(s) that is/are suitable for performing oxide heavy etching operations on work piece 200.

For example, processing of work piece 200 may being with the bulk removal of sacrificial oxide 203 so as to expose at least a portion of fins $202_1$, $202_2$, and $202_y$. Bulk remove of sacrificial oxide 203 may be performed by performing one or multiple oxide heavy etching cycles on work piece 200 of FIG. 2A using the plasma etching technologies described herein. Accordingly, such cycles may involve exposing work piece 200 of FIG. 2A to reactive species of one or more plasmas that exhibit an oxide:nitride etch ratio of greater than 1:1. One example of such a plasma includes a plasma produced by applying 20-50 W of RF power to a first plasma gas flow containing about 10 sccm $NF_3$, 65 sccm $NH_3$, and 130 sccm $H_2$.

During such oxide heavy etch cycle(s), significantly more of sacrificial oxide 203 than nitride layer 206 may be removed from work piece 200 by exposure to such plasmas. This concept is reflected in FIG. 2B, which illustrates that significantly more of sacrificial oxide 203 was removed than nitride layer 205. Following an oxide heavy etching cycle work piece 200 may be annealed (e.g., at 80-160° C. for about 15-300 seconds) to remove the resulting etch byproduct.

Because fields 1 and 2 differ in size, the amount of sacrificial oxide exposed to the oxide heavy etch plasma(s) described above may differ. This is particularly true in instances where region I is narrow (e.g., less than about 50 nm), as etch byproduct produced during the oxide heavy (or other) etches may build up within region I, thus hindering, limiting, or preventing contact of reactive species from the plasma with sacrificial oxide 203 in region I as an etch operation proceeds. As a result, the amount of sacrificial oxide 203 removed from region I during an etching cycle may be less than the amount of sacrificial oxide 203 removed from region II.

Therefore after a given oxide heavy etching cycle, a difference in the height of oxide 203 in region II and region I may exist. For the sake of clarity this height difference is referred to as $\Delta Tox1$, and is illustrated in FIG. 2B. Increasing the number of oxide heavy etch cycles and/or decreasing etch time may reduce or even eliminate $\Delta Tox1$. This is particularly true where a plurality of relatively short oxide heavy etch cycles is used, wherein after each etch cycle work piece 200 is annealed to remove etch byproduct. Without limitation, $\Delta Tox1$ after the performance of one or more oxide heavy etching cycles is preferably less than or equal to about 5 nm, such as less than or equal to about 2 nm.

At this point processing may proceed by exposing work piece 200 to one or more nitride heavy etch cycles, which may be applied to remove at least a portion of native oxide 204 (if present), oxide layer 205, and additional sacrificial oxide 203, so as to further expose fins $202_1$, $202_2$, and $202_y$. More particularly, nitride heavy etch cycle(s) may be applied to expose fins $202_1$, $202_2$, and $202_y$ until such fins exhibit a desired target fin height (TFH). TFH may correspond to the height of fins $202_1$, $202_2$, and $202_y$ that extends above oxide and nitride layers 205, 206 respectively. Without limitation, TFH is preferably greater than or equal to about 35 nm.

By way of example, the work piece of FIG. 2B may be exposed to reactive species of one or more plasmas that exhibit a oxide:nitride etch ratio of 1:greater than 1, such a 1:1.4. One example of such a plasma includes a plasma that may be generated by applying 20-50 W of RF power to a plasma gas flow containing about 50 sccm $NF_3$, 0 sccm $NH_3$, and 130 sccm $H_2$. Consistent with the foregoing description, larger amounts of nitride layer 206 may be removed than oxide layer 205 and/or sacrificial oxide 203 when work piece 200 is exposed to such plasmas. Because such plasmas still exhibit some oxide etch rate, however, at least a portion of oxide layer 205 may be removed.

Without limitation, nitride heavy etch cycles are preferably applied until the height of fins $202_1$, $202_2$, and $202_y$ equals or substantially equals TFH. As shown in FIG. 2C, use of the plasma processing technologies described herein can be used to produce fins having the same or substantially the same target fin height, even when nested and isolated fins are being exposed.

As noted previously, the amount of sacrificial oxide 203 removed from fields I and II during an oxide heavy etching operation, due to the different size of fields I and II and the buildup of etch byproduct. This same issue may occur during the performance of one or more nitride heavy etching cycles. Therefore after a given nitride heavy etching cycle, a difference in the height of oxide 203 in region II and region I may exist.

For the sake of clarity this height difference is referred to as $\Delta Tox2$, and is illustrated in FIG. 2B. Like $\Delta Tox1$, $\Delta Tox2$ may be reduced or even eliminated by increasing the number of nitride heavy etch cycles and/or decreasing etch time. This is particularly true where a plurality of relatively short nitride heavy etch cycles is used, wherein after each etch cycle work piece 200 is annealed to remove etch byproduct. Without limitation, ΔTox2 after the performance of one or more oxide heavy etching operations is preferably less than or equal to about 5 nm, such as less than or equal to about 2 nm, or even about 0 nm.

ΔTox2 may also correlate to the amount by which an upper surface of nitride layer 206 on a fin protrudes above a surface of sacrificial oxide 203 in an adjacent field. This concept is illustrated in FIG. 2C, wherein nitride layer 206 is depicted as protruding above an upper surface of sacrificial oxide 203 in region II. In some embodiments it may be desired to control ΔTox2 and thus, the degree to which nitride layer 206 protrudes above an upper surface of sacrificial oxide 203 in an adjacent region. Indeed, if nitride layer 206 protrudes too far above sacrificial oxide 203, operation of the device being formed from work piece 200 may be compromised. Therefore in some embodiments, at the completion of recess etching nitride layer 206 may protrude over oxide layer 203 by less than or equal to about 5 nm, such as less than or equal to 2 nm, or even about 0 nm.

As may be appreciated, the technologies described herein may enable the production of plasmas that may exhibit desired etching characteristics, such as oxide etch rate, nitride etch rate, and oxide:nitride etch ratio. By controlling the plasma gas flows used to produce such plasmas, one or more of these etching characteristics may be varied. The may enable the design and use of single or multistep plasma etching methodologies, which may be capable of etching diverse materials in an controlled manner As a result, such methodologies may be useful in the production of non-planar devices such as FINFETs, particularly when such devices include fins that are relatively tall and which are spaced by a relatively narrow and/or varying pitch. Indeed as shown by the example of FIGS. 2A-C, the technologies described herein may enable the design and implementation of a multistep etching methodology, which may be capable of recess etching fins to a target fin height of greater than 35 nm, even if some or all of such fins have a fin pitch of less than or equal to about 50 nm.

Accordingly in one example embodiment there is provided a method for selectively etching oxide and nitride on a work piece. The method includes exposing the work piece to a first plasma comprising reactive species of a first plasma gas flow to remove at least a portion of said oxide and nitride at a first oxide:nitride etch ratio, the first plasma gas flow comprising nitrogen trifluoride gas (NF$_3$), ammonia gas (NH$_3$), and hydrogen gas (H$_2$); and exposing the work piece to a second plasma comprising reactive species of a second plasma gas flow to remove at least a portion of said oxide and said nitride at a second oxide:nitride etch ratio, the second plasma gas flow comprising NF$_3$, NH$_3$, and H$_2$; wherein said first and second oxide:nitride etch ratios are different.

Furthermore in another example embodiment there is provided a microelectronic device. The microelectronic device includes first and second fins laterally offset by a fin pitch less than or equal to 50 nm so as to define a first field there between; a conformal oxide layer disposed on at least a portion of said first and second fins; a conformal nitride layer disposed on at least a portion of said first and second fins and on at least a portion of said conformal oxide layer; and a sacrificial oxide material disposed at least within said first field; wherein: said first and second fins extend above said conformal oxide and nitride layers by at least 35 nm; and said conformal nitride layer on said first and second fins protrudes above an upper surface of said sacrificial oxide material within said first field by less than about 5 nm.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A microelectronic device, comprising:
   first and second fins laterally offset by a fin pitch less than or equal to 50 nm so as to define a first field there between;
   a conformal oxide layer disposed on at least a portion of said first and second fins;
   a native oxide layer disposed laterally between said conformal oxide layer and at least a portion of said first and said second fins; wherein said native oxide layer extends upward along at least a portion of a side surface of said first and said second fins, wherein the conformal oxide layer and the native oxide layer have different material compositions;
   a conformal nitride layer disposed on at least a portion of said first and second fins and on at least a portion of said conformal oxide layer; and
   a sacrificial oxide material disposed at least within said first field;
   wherein:
   said first and second fins extend above said conformal oxide and nitride layers by at least 35 nm; and
   said conformal nitride layer on said first and second fins protrudes above an upper surface of said sacrificial oxide material within said first field by less than about 5 nm.

2. The microelectronic device of claim 1, further comprising a third fin laterally offset from said second fin by a fin pitch greater than 50 nm so as to define a second field between said second and third fins, wherein:
   said conformal oxide layer is further disposed on at least a portion of said third fin;
   said conformal nitride layer is further disposed on at least a portion of said third fin and on at least a portion of conformal oxide layer on said third fin;
   said sacrificial oxide material is further disposed within said second field; and
   said conformal nitride layer on said third fin protrudes above an upper surface of said sacrificial oxide material within said second field by less than about 5 nm.

3. The microelectronic device of claim 2, wherein a difference ΔTOx between a height of the sacrificial oxide material in said second field and a height of the sacrificial oxide material in the first field is less than or equal to about 5 nm.

4. The microelectronic device of claim 3, wherein ΔTOx is less than or equal to about 2 nm.

5. The microelectronic device of claim 2, wherein a height of the sacrificial oxide material in said second field and a height of the sacrificial oxide material in said first field are the same.

6. The microelectronic device of claim 2, wherein said conformal nitride layer on said first, second, and third fins protrudes above an upper surface of said sacrificial oxide material within said first and second fields by less than or equal to about 5 nm.

7. The microelectronic device of claim 6, wherein said conformal nitride layer on said first, second and third fins protrudes above an upper surface of said sacrificial oxide material within said first and second fields by less than or equal to about 2 nm.

8. The microelectronic device of claim 2, wherein said microelectronic device is a non-planar transistor.

9. The microelectronic device of claim 1, wherein said conformal oxide layer is formed from an oxide selected from the group consisting of silicon oxide, a silicate, carbon doped oxide, spun on glass, and combinations thereof.

10. The microelectronic device of claim 9, wherein said conformal nitride layer is formed from a silicon nitride or a silicon oxynitride.

11. The microelectronic device of claim 1, wherein said microelectronic device is a non-planar transistor.

* * * * *